(12) United States Patent
Takayama et al.

(10) Patent No.: US 10,254,184 B2
(45) Date of Patent: Apr. 9, 2019

(54) SEMICONDUCTOR PRESSURE SENSOR

(71) Applicant: FUJIKURA LTD., Tokyo (JP)

(72) Inventors: Naoki Takayama, Sakura (JP); Michikazu Tomita, Sakura (JP); Yuki Suto, Sakura (JP); Satoshi Okude, Sakura (JP)

(73) Assignee: FUJIKURA LTD., Tokyo (JP)

( * ) Notice: Subject to any disclaimer, the term of this patent is extended or adjusted under 35 U.S.C. 154(b) by 68 days.

(21) Appl. No.: 15/022,731

(22) PCT Filed: Oct. 3, 2014

(86) PCT No.: PCT/JP2014/076551
§ 371 (c)(1),
(2) Date: Mar. 17, 2016

(87) PCT Pub. No.: WO2015/050247
PCT Pub. Date: Apr. 9, 2015

(65) Prior Publication Data
US 2016/0209284 A1    Jul. 21, 2016

(30) Foreign Application Priority Data

Oct. 4, 2013  (JP) ................................. 2013-209568
Mar. 7, 2014  (JP) ................................. 2014-045705

(51) Int. Cl.
| G01L 19/04 | (2006.01) |
| G01L 19/14 | (2006.01) |
| G01L 9/00  | (2006.01) |
| G01L 9/02  | (2006.01) |
| G01L 19/00 | (2006.01) |
| G01L 19/06 | (2006.01) |

(Continued)

(52) U.S. Cl.
CPC .......... *G01L 9/0042* (2013.01); *G01L 9/0051* (2013.01); *G01L 9/025* (2013.01);
(Continued)

(58) Field of Classification Search
CPC .......... G01L 9/00; G01L 9/0042; G01L 9/02; G01L 9/06; G01L 9/08; G01L 19/00;
(Continued)

(56) References Cited

U.S. PATENT DOCUMENTS

| 5,948,991 A    | 9/1999 | Nomura et al. |
| 2007/0164402 A1 | 7/2007 | Jung et al. |

(Continued)

FOREIGN PATENT DOCUMENTS

| CN | 1391277 A   | 1/2003 |
| CN | 101680812 A | 3/2010 |

(Continued)

OTHER PUBLICATIONS

Communication dated Feb. 22, 2017 issued by the State Intellectual Property Office of People's Republic of China in the in counterpart Chinese Application No. 201480053329.2.
(Continued)

*Primary Examiner* — Nguyen Q. Ha
(74) *Attorney, Agent, or Firm* — Sughrue Mion, PLLC

(57) ABSTRACT

A semiconductor pressure sensor of the invention, includes: a base body (1) including: a lead frame (4) having a first surface and a second surface; and a support (5) that supports the lead frame (4) and is made of a resin; a pressure sensor chip (2) provided on the first surface of the lead frame (4); and a controller (3) that is provided on the second surface of the lead frame (4), is implanted in the support (5), is formed in the shape having a plurality of surfaces, includes a stress relief layer (32, 33, 34, 35, 36) that is formed on at least one of the plurality of surfaces and has a Young's modulus lower than that of the support (5), and receives a sensor signal output from the pressure sensor chip (2) aid thereby outputs a pressure detection, the pressure sensor chip (2) at least partially overlapping the controller (3) in plan view.

9 Claims, 6 Drawing Sheets

(51) Int. Cl.
*H01L 23/053* (2006.01)
*H01L 23/16* (2006.01)
*H01L 23/495* (2006.01)
*H01L 23/498* (2006.01)
*H01L 23/00* (2006.01)

(52) U.S. Cl.
CPC ...... *G01L 19/0069* (2013.01); *G01L 19/0092* (2013.01); *G01L 19/04* (2013.01); *G01L 19/0654* (2013.01); *G01L 19/145* (2013.01); *H01L 23/053* (2013.01); *H01L 23/16* (2013.01); *H01L 23/4952* (2013.01); *H01L 23/49558* (2013.01); *H01L 23/49575* (2013.01); *H01L 23/49861* (2013.01); *H01L 24/48* (2013.01); *H01L 2224/48091* (2013.01); *H01L 2224/48106* (2013.01); *H01L 2224/48247* (2013.01); *H01L 2224/49175* (2013.01); *H01L 2224/73265* (2013.01); *H01L 2224/8592* (2013.01); *H01L 2924/00014* (2013.01); *H01L 2924/152* (2013.01); *H01L 2924/181* (2013.01); *H01L 2924/1815* (2013.01)

(58) Field of Classification Search
CPC . G01L 19/0069; G01L 19/0092; G01L 19/04; G01L 19/0654; G01L 19/14; G01L 19/145
See application file for complete search history.

(56) References Cited

U.S. PATENT DOCUMENTS

2007/0234804 A1* 10/2007 Tamura ............... G01L 19/0069
73/526

2008/0098819 A1* 5/2008 Murata ............... G01L 19/0627
73/708
2008/0169538 A1 7/2008 Kasuya et al.
2010/0133631 A1 6/2010 Benzel

FOREIGN PATENT DOCUMENTS

| | | |
|---|---|---|
| CN | 102376677 A | 3/2012 |
| JP | 62-210651 A | 9/1987 |
| JP | 9-289269 A | 11/1997 |
| JP | H-3274963 B | 4/2002 |
| JP | 3620185 B2 | 2/2005 |
| JP | 2008014875 A * | 1/2008 ............... G01L 9/00 |

OTHER PUBLICATIONS

Communication dated Aug. 1, 2016, from the European Patent Office in counterpart European Application No. 14851283.3.
Machine translation of JP 62-210651, published Sep. 16, 1987 (JP was filed with IDS dated Mar. 17, 2016).
Notice of Allowance dated Aug. 22, 2017 in counterpart application No. 2014-045705.
Communication dated Jun. 13, 2017, from the Japanese Patent Office in counterpart application No. 2014-045705.
Communication dated Jul. 4, 2017, from the European Patent Office in counterpart European Application No. 14851283.3.
Communication dated Jul. 20, 2017, from State Intellectual Property Office of the P.R.C. In counterpart application No. 201480053329.2.
Communication dated Nov. 16, 2017 from the State Intellectual Property Office of the P.R.C. in counterpart Chinese application No. 201480053329.2.

* cited by examiner

SEMICONDUCTOR PRESSURE SENSOR

CROSS REFERENCE TO RELATED APPLICATIONS

This application is a National Stage of International Application No. PCT/JP2014/076551 filed Oct. 3, 2014, claiming priority based on Japanese Patent Application Nos. 2013-209568 filed Oct. 4, 2013 and 2014-045705 filed Mar. 7, 2014, the contents of all of which are incorporated herein by reference in their entirety.

TECHNICAL FIELD

The present invention relates to a semiconductor pressure sensor which can be used in a portable device or the like, such as a wrist watch for divers provided with a water depth meter.

BACKGROUND ART

Conventionally, a small semiconductor pressure sensor (hereinbelow, simply referred to as a pressure sensor) which utilizes MEMS technology (Micro Electro-Mechanical Systems) is used in a portable device or the like (for example, refer to Patent Document 1).

As this kind of pressure sensor, for example, a pressure sensor is known which has: a pressure sensor chip; and a controller that receives a sensor signal output from the pressure sensor chip and outputs a pressure detection.

PRIOR ART DOCUMENTS

Patent Documents

[Patent Document 1] Japanese Patent No. 3620185

SUMMARY OF INVENTION

Problems to be Solved by the Invention

In recent years, it is required to reduce the size of a pressure sensor with miniaturization of portable devices.

The invention was made with respect to the above-described problems and has an object to provide a pressure sensor that can be reduced in size.

Means for Solving the Problems

A semiconductor pressure sensor according to one aspect of the invention includes: a base body including: a lead frame having a first surface and a second surface; and a support that supports the lead frame and is made of a resin; a pressure sensor chip provided on the first surface of the lead frame; and a controller that is provided on the second surface of the lead frame, is implanted in the support, is formed in the shape having a plurality of surfaces, includes a stress relief layer that is formed on at least one of the plurality of surfaces and has the Young's modulus lower than that of the support, and receives a sensor signal output from the pressure sensor chip and thereby outputs a pressure detection, the pressure sensor chip at least partially overlapping the controller in plan view.

In the semiconductor pressure sensor according to one aspect of the invention, the stress relief layer may cover an entire surface of the controller.

In the semiconductor pressure sensor according to one aspect of the invention, the stress relief layer may have an external surface forming a curved convex surface.

In the semiconductor pressure sensor according to one aspect of the invention, the Young's modulus of the stress relief layer may be less than or equal to $\frac{1}{10}$ of the Young's modulus of the support.

In the semiconductor pressure sensor according to one aspect of the invention, each of the pressure sensor chip and the controller may be connected to the lead frame via a bonding wire.

In the semiconductor pressure sensor according to one aspect of the invention, the support include: a base; and a mounting portion on which the pressure sensor chip is mounted, and the mounting portion may be formed of a material having a hardness lower than a material used to form the base.

In the semiconductor pressure sensor according to one aspect of the invention, a container that accommodates the pressure sensor therein may be formed on the base, the container may be filled with a protective material that covers the pressure sensor chip, and the protective material may be capable of transmitting, to the pressure sensor chip, a pressure applied from a measurement object.

In the semiconductor pressure sensor according to one aspect of the invention, the lead frame may be implanted in the support.

Effects of the Invention

According to one aspect of the invention, since the pressure sensor chip and the controller are located at the position at which, the pressure sensor chip at least partially overlaps the controller in plan view, it is possible to reduce the total space which is occupied by the pressure sensor chip and the controller. Consequently, it is possible to reduce the size of the pressure sensor.

Moreover, since the pressure sensor chip is provided adjacent to the controller, an electrical wiring (bonding wire or the like) that connects the pressure sensor chip and the controller becomes shortened. For this reason, it is possible to improve the resistance to electromagnetic noise, and it is possible to improve the detection accuracy of the pressure sensor.

In addition, since the pressure sensor chip is located adjacent to the controller, it is possible to reduce the difference in temperature between the pressure sensor chip and the controller. Accordingly, in the case where the controller is provided with a temperature sensor, a detected value of the pressure sensor is stabilized, and it is possible to improve the accuracy thereof.

EMBODIMENTS FOR CARRYING OUT THE INVENTION

Hereinafter, a first embodiment of the invention will be described based on preferred embodiment with reference to drawings.

Figure 1:
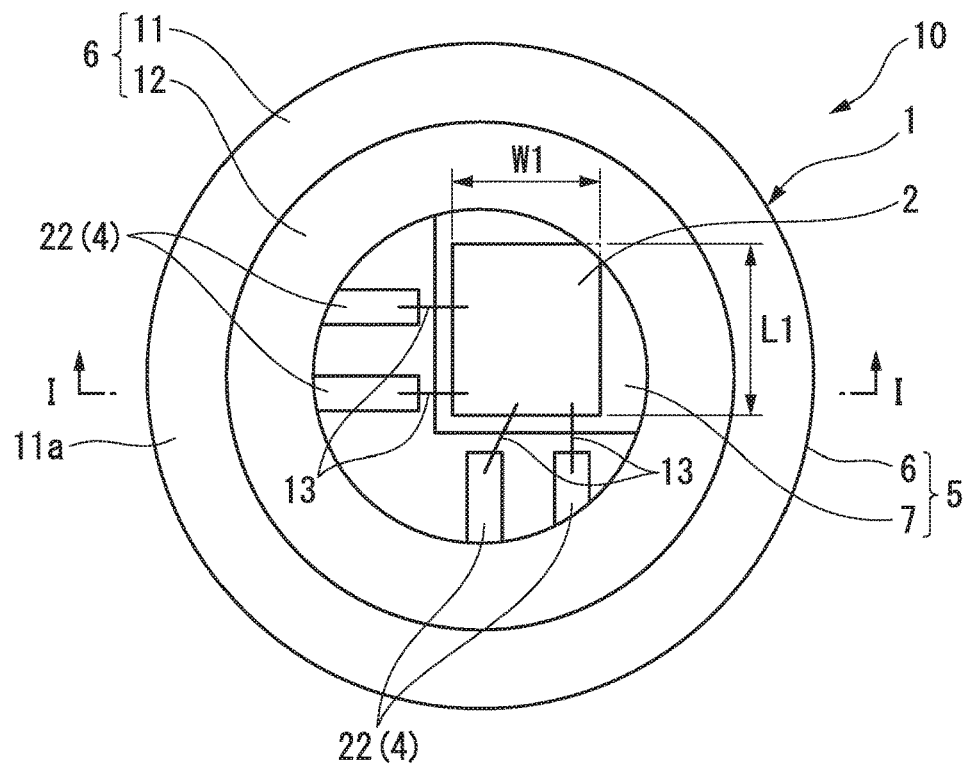
FIG. 1 is a plan view showing a pressure sensor according to the first embodiment of the invention.
Figure 2:
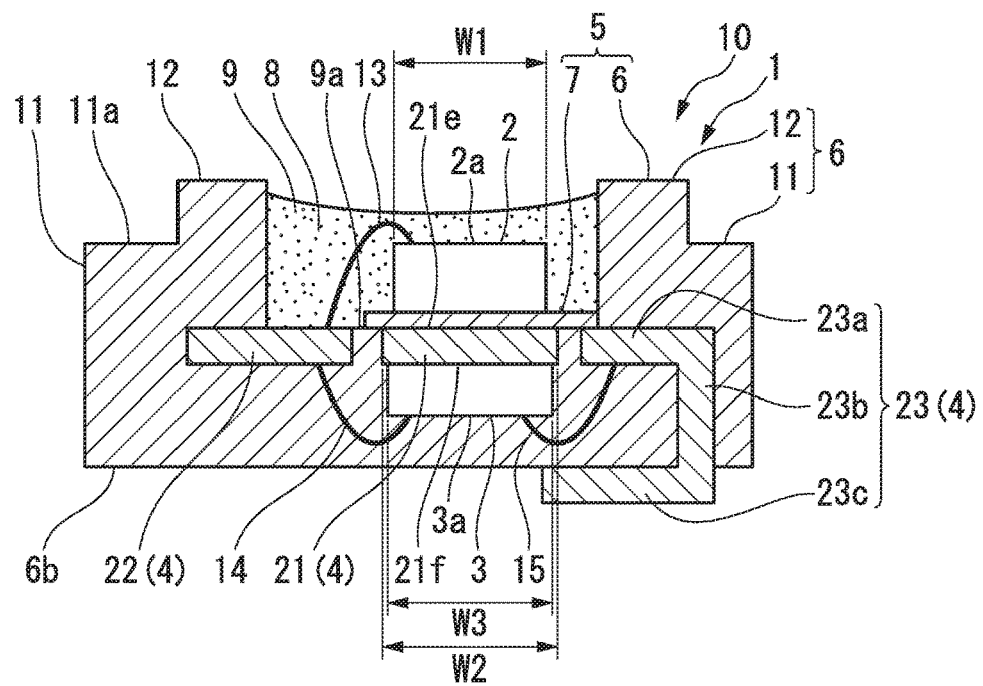
FIG. 2 is a cross-sectional side view taken along the line I-I shown in FIG. 1.
Figure 3:
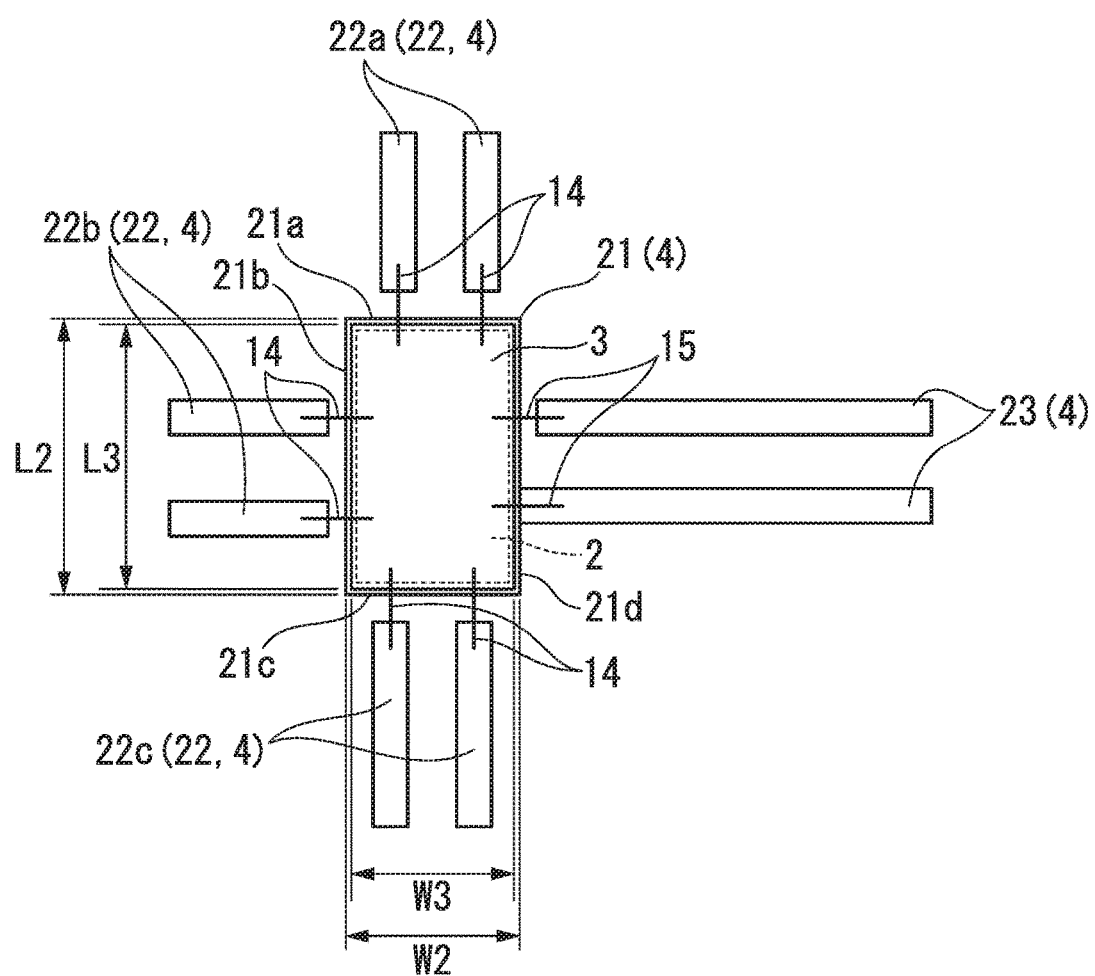
FIG. 3 is a development view showing the structure of a lead frame used in the pressure sensor shown in FIG. 1 as seen from the lower surface side of the lead frame.

FIG. 1 is a plan view showing a pressure sensor 10 which is a semiconductor pressure sensor according to a first embodiment of the invention (hereinbelow, simply referred to as a pressure sensor). FIG. 2 is a cross-sectional side view showing the pressure sensor 10. FIG. 3 is a development view showing the structure of a lead frame 4 used in the pressure sensor 10 as seen from the lower surface side of the lead frame 4.

In the following explanation, "upper" and "lower" correspond to the upper and lower positions in the vertical direction shown in FIG. 2, respectively. Furthermore, the height direction means the upward direction shown in FIG. 2. As shown in FIGS. 1 and 3, "plan view" means the plane that is seen from the thickness direction of the lead frame 4.

As shown in FIGS. 1 and 2, the pressure sensor 10 includes: a base body 1, a pressure sensor chip 2 (pressure sensing device) provided on the base body 1, and a controller 3 (control device) built in the base body 1.

As shown in FIGS. 2 and 3, the base body 1 includes: the lead frame 4; and a support 5 (package) that supports the lead frame 4 and is made of a resin.

The lead frame 4 has a first surface and a second surface. The pressure sensor chip 2 is provided on first surface of the lead frame 4. The controller 3 is provided on the second surface of the lead frame 4.

The support 5 includes: a base 6 formed in a circular shape in plan view; and a mounting portion 7 on which the pressure sensor chip 2 is mounted.

The base 6 includes: a base body 11, and an annular wall 12 that protrudes upward from an upper surface 11a of the base body 11. The annular wall 12 can be formed integrally with the base body 11. The annular wall 12 shown as an example in the drawing is formed in a cylindrical shape.

The internal space of the annular wall 12 is a container 9 that accommodates the pressure sensor chip 2 and a protective material 8 therein. In the drawing shown as an example, the container 9 is a cylindrical-shaped space that is partitioned by the annular wall 12.

As shown in FIG. 2, it is preferable that a bottom surface 9a of the container 9 be located at the position which is lower than the upper surface 11a of the base body 11 outside the annular wall 12.

The annular wall 12 can be formed to protrude upward so as to reach the position which is upper than the upper surface 2a of the pressure sensor chip 2. Consequently, it is possible to prevent the pressure sensor chip 2 from being affected by an external force.

The base 6 can be formed by an integral molding by use of a resin.

A resin used to form the base 6 is, for example, an epoxy resins; and the Young's modulus of the resin is, for example, 1 GPa to 50 GPa (preferably, 10 GPa to 30 GPa).

Particularly, the shape of the base 6 and the annular wall 12 which are shown as an example in the drawing is a circular shape in plan view; however, the shape of the base 6 and the annular wall 12 in plan view is not limited to those shape, an arbitrary shape such as a rectangular shape or other polygonal shapes can be adopted. The internal space of the annular wall 12 has the shape corresponding to the inner surface shape of the annular wall 12 in plan view. For example, in the case where the inner surface of the annular wall 12 is formed in a rectangular shape in plan view, the shape of the container 9 is also a rectangular shape in plan view.

The mounting portion 7 can be formed on part of the region of or the entire region of the bottom surface 9a so as to have a substantially constant thickness. The mounting portion 7 shown as an example in the drawing is formed on part of the region of the bottom surface 9a.

The material used to form the mounting portion 7 is the same as the resin material used to form the base 6. The mounting portion 7 may be formed of a, material having a hardness lower than that of the base 6. As a result of forming the mounting portion 7 by use of a resin material having a hardness lower than that of the base 6, an external force which is applied to the pressure sensor chip 2 due to the thermal expansion or the like of the base 6 is relieved, and it is possible to improve the measurement accuracy of the pressure sensor 10. As the thickness of the resin increases, the degree of the effect of relieving the external force increases.

Alternatively, by forming the mounting portion 7 using the same material as the resin material used to form the base 6, the resin material having hardness lower than that of the base 6 may be provided between the mounting portion 7 and the pressure sensor chip 2. Even in this case, an external force which is applied to the pressure sensor chip 2 due to the thermal expansion or the like of the base 6 is relieved, and it is possible to improve the measurement accuracy of the pressure sensor 10.

As shown in FIG. 3, the lead frame 4 is formed of an electrical conductor such as a metal. The lead frame 4 includes: a tabular pedestal 21 formed in a rectangular shape in plan view; sensor leads 22 that extend in the direction such that the sensor leads become far from the pedestal 21 in a plane parallel to the pedestal 21; and terminal leads 23 that extend in the direction such that the terminal leads become far from the pedestal 21.

As seen from a plan view, the sensor leads 22 includes: first sensor leads 22a, second sensor leads 22b, and third sensor leads 22c. The first sensor leads 22a, the second sensor leads 22b, and the third sensor leads 22c can be formed vertical to the first side edge 21a, the second side edge 21b, and the third side edge 21c of the pedestal 21 formed in a rectangular shape in plan view, respectively. The first sensor leads 22a, the second sensor leads 22b, and the third sensor leads 22c may be formed so as to be inclined with respect to the first side edge 21a, the second side edge 21b, and the third side edge 21c, respectively, at a predetermined angle (more than 0 degrees to less than 90 degrees).

As shown in FIG. 2, the first sensor lead 22a, the second sensor lead 22b, and the third sensor lead 22c are connected to the pressure sensor chip 7 via the respective bonding wires 13 (pressure sensor chip bonding wires) and are connected to the controller 3 via bonding wires 14 (controller bonding wires).

As shown in FIG. 1, part of the upper surface of the sensor lead 22 (part of the upper surface of the sensor leads 22b and 22c shown as an example in the drawing) may be exposed at the bottom surface 9a of the container 9.

The pedestal 21 may be or may not be exposed at the bottom surface 9a of the container 9. In the drawing shown as an example, since the pedestal 21 is covered with the mounting portion 7, the pedestal is not exposed.

As shown in FIG. 3, the terminal leads 23 can be formed perpendicular to the fourth side edge 21d of the pedestal 21 in plan view. The terminal leads 23 may be formed so as to be inclined with respect to the fourth side edge 21d at a predetermined angle (exceeds 0 degrees, less than 90 degrees).

As shown in FIG. 2, the terminal lead 23 shown as an example in the drawing includes: a base-extending portion 23a that extends in the direction such that base-extending portion becomes far from the pedestal 21; an intermediate-extending portion 23b that extends downward from the extending end of the base-extending portion 23a; and an outer extending portion 23c that extends from the extending end of the intermediate-extending portion 23b in the direction opposite to the extending direction of the base-extending portion 23a.

As shown in FIG. 2, the base-extending portion 23a and the intermediate-extending portion 23b can be formed and implanted into the inside of the support 5.

The base-extending portion 23a is connected to the controller 3 via the bonding wire 15 (controller bonding wire).

The outer extending portion 23c is exposed at the lower surface 6b of the base 6 and is formed along the lower surface 6b.

The leads 22 and 23 are implanted in the base 6 with the exception of the outer extending portion 23c.

In the drawing shown as an example, since the bonding wires 14 and 15 are implanted into the resin of the base 6, it is possible to prevent the bonding wires 14 and 15 from being damaged.

Since the lead frame 4 is formed of a plate material which is made of a metal or the like, the lead frame has a certain measure of surface area and a high degree of rigidity, and therefore it is advantageous to prevent infiltration of water passing through the container 9.

Furthermore, since the lead frame 4 has excellent thermal conductivity, overheating or supercooling of the pressure sensor chip 2 and the controller 3 is prevented, and it is advantageous to stabilize the operations of the pressure sensor chip 2 and the controller 3.

In particular, the terminal leads 23 are formed to be bent in this example; however, the terminal leads may be formed in a shape in which a bend portion is not formed (linear). In this case, the terminal leads 23 do not protrude from the lower surface 6b of the base 6 and protrude from the side surface thereof.

Moreover, in the case where a gap occurs between the lead frame 4 and the base 6 or in the case where there is a concern that a gap occurs therebetween, as a result of sealing the boundary between the lead frame 4 and the base 6 by use of a sealing resin, it is possible to improve waterproofness.

As the configuration of the pressure sensor chip 2 shown in FIG. 2, for example, a structure can be used which includes: a diaphragm; a sealed space serving as a reference pressure chamber; and a plurality of strain gauges that measure a variation in the strain resistance of the diaphragm due to a pressure, which are provided on one surface of a semiconductor substrate made of silicon or the like.

The respective strain gauges can be electrically connected to the respective leads 22a to 72c and 73.

In the pressure sensor chip 2 described in this example, when the diaphragm receives a pressure and is thereby bent, the stress corresponding to the amount of strain of the diaphragm is applied to each strain gauge, the resistance value of the strain gauge varies depending on this stress, and the sensor signal corresponding to the variation in the resistance value is thereby output.

This pressure sensor chip 2 is a pressure sensor chip utilizing MEMS (Micro Electro-Mechanical Systems) technology.

The pressure sensor chip 2 is accommodated in the container 9, mounted on the mounting portion 7, and is fixed to the mounting portion 7.

The pressure sensor chip 2 is provided on the upper surface side (first surface) of the lead frame 4. Particularly, the pressure sensor chip 2 is provided at the position close to the upper surface 21e of the pedestal 21 along the upper surface 21e.

As long as the pressure sensor chip 2 is provided at the same position as that of the upper surface of the lead frame 4 or at the position higher than that of the upper surface, part of the region or the entire region of the pressure sensor chip 2 may be provided at the position apart from the lead frame 4 in plan view.

The pressure sensor chip 2 shown as an example in the drawing is provided on the pedestal 21 with the mounting portion 7 interposed therebetween.

Since the pressure sensor chip 2 has a circuit formed on the upper surface 2a, the bonding wire 13 is connected to the upper surface 2a of the pressure sensor chip 2.

As shown in FIG. 1, the width W1 of the pressure sensor chip 2 can be slightly smaller than the width W2 of the pedestal 21 of the lead frame 4 shown in FIGS. 2 and 3. The length L1 of the pressure sensor chip 2 can be slightly smaller than the length L2 of the pedestal 21 of the lead frame 4 shown in FIG. 3.

In the drawing shown as an example, the pressure sensor chip 2 is formed within the range that is included in the range in which the pedestal 21 is formed in plan view.

Particularly, the width of the pressure sensor chip 2 may be equal to the width of the pedestal 21 or greater than the width of the pedestal 21. The length of the pressure sensor chip 2 may be equal to the length of the pedestal 21 or greater than the length of the pedestal 21.

It is preferable that the pressure sensor chip 2 be covered with the protective material 8 filling the container 9. The protective material 8 prevents infiltration of water or external air and can prevent any negative effect on the pressure sensor chip 2.

As the protective material 8, for example, a silicon based resin (for example, silicone resin) or a fluorine based resin can be used. As the protective material 8, a liquiform or a gel state protective material can be used. It is preferable that the protective material 8 have a high degree of viscosity.

As the protective material 8, it is preferable to use, for example, a soft gel agent having approximately zero hardness (Shore A hardness, in compliance with JIS K 6253).

The protective material 8 can directly transit to the pressure sensor chip 2, a pressure applied from a measurement object. Consequently, the accuracy of detecting a pressure by the pressure sensor chip 2 is not degraded.

It is preferable that the protective material 8 have a low degree of optical transparency. For this reason, since it is possible to block visible light or ultraviolet light, it is advantageous to prevent the pressure sensor chip 2 from being deteriorated.

The optical transparency of the protective material 8 can be lowered by adding pigment or the like thereto.

When a sensor signal output from the pressure sensor chip 2 is input to the controller 3 through the bonding wire 13, the lead frame 4, and the bonding wires 14 and 15, the controller processes the output sensor signal and can output the signal as a pressure detection signal.

The controller 3 has functions of, for example, controlling ON/OFF of the pressure sensor chip 2, correcting a detected value by a temperature sensor built therein, A/D conversion of detection data, correction of linearity, shaping a signal waveform, or the like.

The controller 3 is provided at the lower surface side (second surface) of the lead frame 4. Particularly, the controller 3 is provided at the position close to the lower surface 21f of the pedestal 21 along the lower surface 21f.

As long as the controller 3 is provided at the same position as that of the lower surface of the lead frame 4 or the position lower than the lower surface, part of the region or the entire region of the controller 3 may be provided at the position apart from the lead frame 4 in plan view.

As shown in FIGS. 2 and 3, the width W3 of the controller 3 can be slightly smaller than the width W2 of the pedestal 21 of the lead frame 4. The length L3 of the controller 3 can be slightly smaller than the length L2 of the pedestal 21 of the lead frame 4.

In the drawing shown as an example, the controller 3 is formed within the range that is included in the range in which the lead frame 4 is formed in plan view.

Particularly, the width of the controller 3 may be equal to the width of the pedestal 21 or greater than the width of the pedestal 21. The length of the controller 3 may be equal to the length of the pedestal 21 or greater than the length of the pedestal 21.

A temperature sensor may be built in the controller 3. The controller 3 having the temperature sensor built therein can correct a pressure detection signal depending on a temperature inside of a system. Accordingly, pressure measurement with a high degree of accuracy is possible.

As shown in FIG. 2, the controller 3 is implanted into the support 5 (the base 6) and is formed integrally with the support 5. Since the outer surface of the controller 3 is covered, the controller 3 blocked from external air or moisture, it is possible to protect the controller 3.

As shown in FIGS. 2 and 3, at least part of the controller 3 is positioned so as to overlap the pressure sensor chip 2 in plan view. In the drawing shown as an example, part of the center region of the controller 3 is located at the position that overlaps the pressure sensor chip 2. Because of this, the controller 3 contains the entirety of the pressure sensor chip 2 in plan view.

In particular, in this example, the part of the center region of the controller 3 overlaps the entire region of the pressure sensor chip 2 in plan view; however, the part of the region of the controller 3 may overlap part of the region of the pressure sensor chip 2, or the entire region of the controller 3 may be located at the position that overlaps part of the region or the entire region of the pressure sensor chip 2.

Since the controller 3 has a lower surface 3a on which a circuit is formed, the bonding wires 14 and 15 are connected to the lower surface 3a.

As described above, the circuit is formed on the upper surface 2a of the pressure sensor chip 2 that is provided on the upper surface side of the lead frame 4. The circuit is formed on the lower surface 3a of the controller 3 that is provided on the lower surface side of the lead frame 4. Consequently, the interconnection length is shortened and it is possible to reduce the effect of noise generated from external side.

Next, an example method of manufacturing the pressure sensor 10 will be described with reference to FIGS. 4 and 5.

Figure 4:
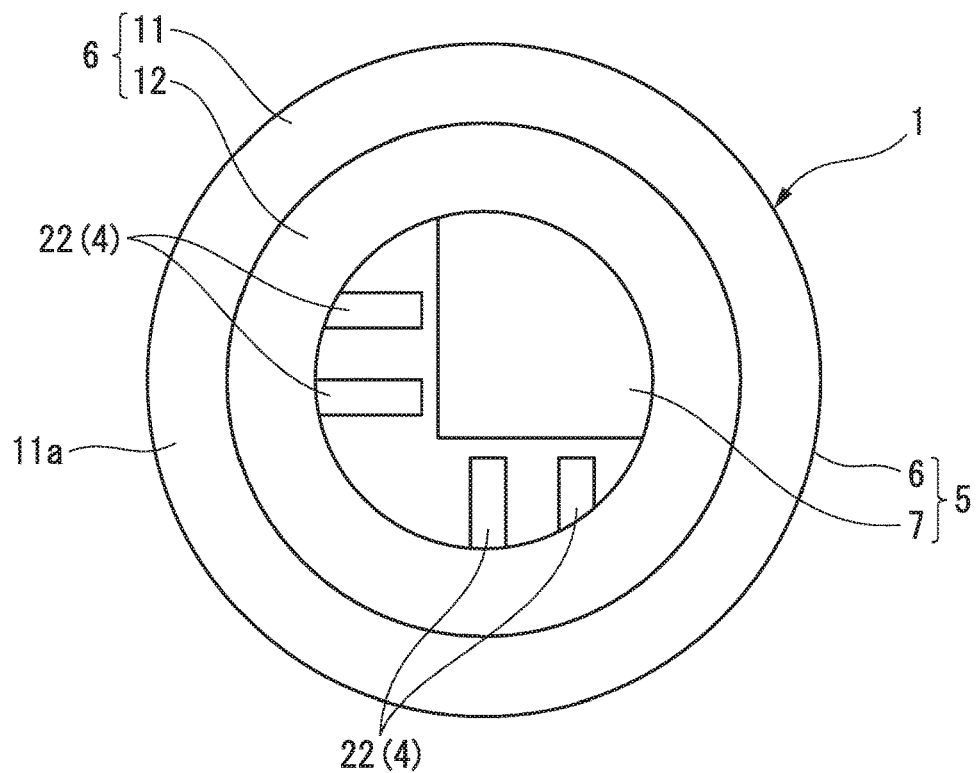
FIG. 4 is a flow sheet showing a step of manufacturing the pressure sensor shown in FIG. 1 and is a plan an view showing a pressure sensor before the pressure sensor chip is provided.
Figure 5:
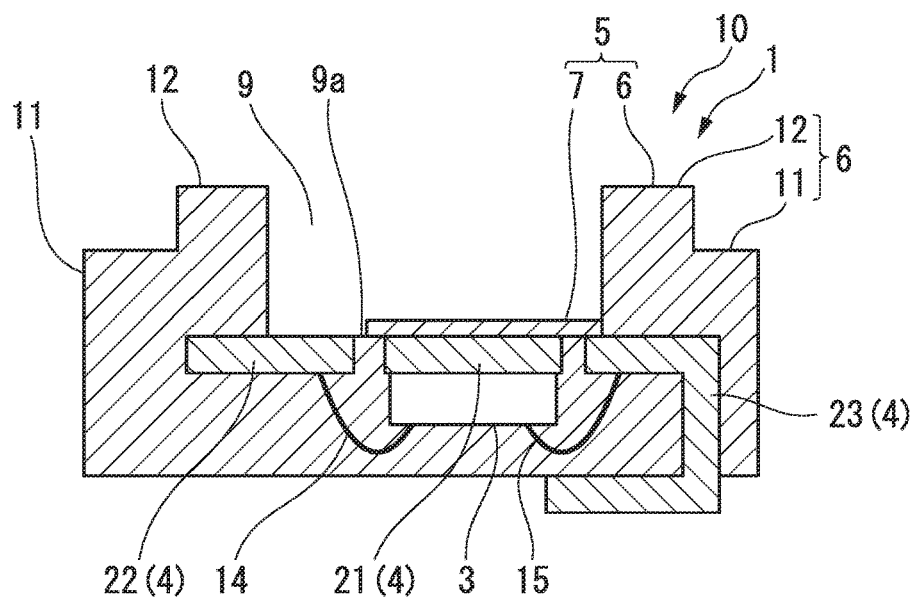
FIG. 5 is a cross-sectional side view showing the pressure sensor in the step shown in the previous drawing.

As shown in FIGS. 4 and 5, the controller 3 is mounted on the pedestal 21 of the lead frame 4 and is connected to the leads 22 and 23 via the bonding wires 14 and 15.

Subsequently, the support 5 is formed by resin-molding or the like. Consequently, the controller 3 and the bonding wires 14 and 15 are implanted into the support 5 and are thereby in a state of not being exposed to the external side.

Part of the upper surface of the lead frame 4 (for example, part of the upper surface of the sensor lead 22 shown in FIG. 4) may be exposed to the inside of the container 9. The pedestal 21 may be or may not be exposed. In the drawing shown as an example, the pedestal 21 is covered with the mounting portion 7.

After that, the pressure sensor chip 2 is provided on the mounting portion 7, and the pressure sensor chip 2 is connected to the sensor leads 22 with the bonding wires 13 interposed therebetween.

Next, the pressure sensor chip 2 is covered with the protective material 8 by filling the container 9 therewith.

Therefore, the pressure sensor 10 shown in FIGS. 1 and 2 is obtained.

In the pressure sensor 10, since the controller 3 and the pressure sensor chip 2 are located so that the controller at least partially overlaps the pressure sensor chip, it is possible to reduce the total space which is occupied by the pressure sensor chip 2 and the controller 3. Consequently, it is possible to reduce the pressure sensor 10 in size.

In the pressure sensor 10, since the pressure sensor chip 2 comes close to the controller 3, the lengths of the electrical wirings (the bonding wires 13 to 15 or the like) which are connected to the pressure sensor chip 2 and the controller 3 become shortened. For this reason, it is possible to improve the resistance to electromagnetic noise, and it is possible to improve the detection accuracy.

In addition, since the pressure sensor chip 2 is located adjacent to the controller 3, it is possible to reduce the difference in temperature between the pressure sensor chip 2 and the controller 3. Accordingly, in the case where the controller 3 is provided with a temperature sensor, a detected value of the pressure sensor is stabilized, and it is possible to improve the accuracy thereof.

In the pressure sensor 10, since the controller 3 is implanted in the support 5 made of a resin, it is possible to realize the configuration in which the wirings (for example, the bonding wires 14 and 15) of the controller 3 to which a high voltage is applied are not exposed, the durability thereof is improved, and it is possible to ensure a long-term reliability.

In the pressure sensor 10, connection reliability between the pressure sensor chip 2 and the lead frame 4 and between the controller 3 and the lead flame 4 is improved by use of the bonding wires 13 to 15, and it is possible to detect a pressure with a high degree of accuracy.

Figure 6:
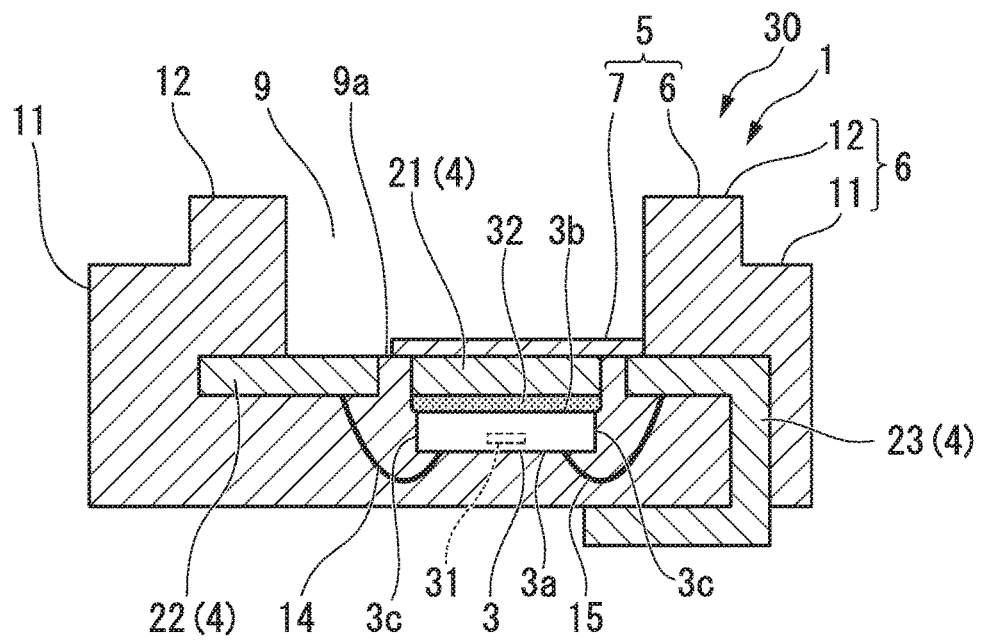
FIG. 6 is a cross-sectional side view showing a pressure sensor according to the second embodiment of the invention.

FIG. 6 shows a cross-sectional side view showing a pressure sensor 30 serving as a pressure sensor according to a second embodiment of the invention.

Particularly, in FIGS. 6 to 11, the pressure sensor chip 2 and the protective material 8 are not shown in the drawings, and the structure according to the aforementioned first embodiment is adopted. In each embodiment described below, identical reference numerals are used for the elements which are common to the aforementioned pressure sensor, and the explanations thereof are omitted or simplified here.

The pressure sensor 30 preferably uses the controller 3 including a temperature sensor.

As the controller 3, for example, a structure can be adopted which includes: a temperature sensor 31 that measures an outside temperature; an A/D converter (not shown in the figure) that A/D-converts a signal output from the temperature sensor 31 and outputs the signal as a temperature signal; and a processor (not shown in the figure) to which the temperature signal is input.

Based on the temperature signal, the processor can carry out a process of correcting the sensor signal output from the pressure sensor chip 2.

As the temperature sensor 31, a resistance-type temperature sensor (bridge resistance type), a diode-type temperature sensor, a thermocouple temperature sensor, an infrared light temperature sensor, or the like is adopted.

As the shape of the controller 3, for example, a rectangular parallelepiped shape can be adopted which includes: a rectangular-shaped bottom surface 3b; side surfaces 3c formed on the respective peripheral edge portions that correspond to four side portions of the bottom surface 3b; and an outer surface 3a (the lower surface 3a). That is, the controller 3 is formed in the shape having a plurality of surfaces.

The temperature sensor 31 can be provided at the position that is inside the controller 3 and is adjacent to the outer surface 3a (the lower surface 3a).

In the pressure sensor 30 described in this example, a stress relief layer 32 including a material having a low Young's modulus (Young's modulus lower than that of the support 5) is formed on the bottom surface 3b of the controller 3 (at least one of the plurality of surfaces).

The stress relief layer 32 (inner-face stress relief layer 32) shown an example in the drawing covers the entire area of the bottom surface 3b of the controller 3 and is interposed between the lead frame 4 (the pedestal 21) and the controller 3. Accordingly, the bottom surface 3b is apart from the lead frame 4. The stress relief layer 32 shown as an example in the drawing is formed so as to have a constant thickness.

The Young's modulus of the stress relief layer 32 is lower than the Young's modulus of the base 6 (the support 5). Also, the stress relief layer 32 is lower than the lead frame 4 in Young's modulus.

In this example, the outer surface 3a (the lower surface 3a) and the side surfaces 3c of the controller 3 is in contact with the base 6.

The stress relief layer 32 may be formed on only part of the bottom surface 3b.

As the material having a low Young's modulus used to form the stress relief layer 32, a material can be used which has the Young's modulus in the case where after curing is subjected thereto lower than the Young's modulus of the material used to form the base 6, for example, a thermosetting resin, a ultraviolet curable resin, or the like can be used. Specifically, for example, a silicone resin, epoxy-based resins, urethane resins, poly imide resins, or the like can be used. As the material having a low Young's modulus, one of the above-mentioned materials may be used, or two or more thereof may be concomitantly used. Above all, particularly, since a silicone resin is difficult to absorb moisture, it is preferable in that the physical properties thereof are difficult to vary even in a high temperature and high humidity environment.

The Young's modulus of the stress relief layer 32 is preferably, for example, 1 MPa to 500 MPa (more preferably, 1 MPa to 100 MPa).

It is preferable that the Young's modulus of the stress relief layer 32 be less than or equal to $\frac{1}{10}$ (more preferably, $\frac{1}{100}$ or less) of the Young's modulus of the material used to form the base 6. Particularly, the Young's modulus can be measured by methods of JIS K 7161, JIS K 7244.

The thickness of the stress relief layer 32 can be, for example, 5 to 100 μm (preferably, 10 to 50 μm). By setting the thickness of the stress relief layer 32 to be 5 μm or more, a high degree of stress relief effect can be obtained. Furthermore, by setting the thickness to be 100 μm or less, the entire thickness can be reduced.

Regarding the configuration of the pressure sensor 30, the same configuration as that of the pressure sensor 10 according to the first embodiment shown in FIG. 2 or the like may be adopted with the exception that the stress relief layer 32 (inner-face stress relief layer 32) is provided.

Next, an example of a method of manufacturing the pressure sensor 30 will be described.

An uncured (liquiform) material having a low Young's modulus is supplied to the controller 3 or the pedestal 21 by a dispenser or the like, the material is cured by heating or the like, and the stress relief layer 32 is thereby formed.

The controller 3 is connected to the leads 22 and 23 via the bonding wires 14 and 15, respectively.

Subsequently, the support 5 is formed by resin-molding or the like.

After that, the pressure sensor chip 2 is provided on the mounting portion 7, the pressure sensor chip 2 is connected to the sensor lead 22 via the bonding wire 13.

Next, the pressure sensor chip 2 is covered with the protective material 8 by filling the container 9 therewith. Consequently, the pressure sensor 30 is obtained.

In other cases, the stress relief layer 32 can also be formed by attaching a sheet made of a material having a low Young's modulus to the controller 3 or the pedestal 21.

In the pressure sensor 30, the bottom surface 3b of the controller 3 is in contact with the stress relief layer 32. Consequently, a stress generated from peripheral components around the controller 3 (the base 6, the lead frame 4) is released, therefore, an error of output from the temperature sensor 31 of the controller 3 can be avoided from increasing, and therefore it is possible to improve measurement accuracy of the pressure sensor 30. Hereinbelow, this effect will be particularly described.

A stress generated when a resin is cured or a heat stress or the like generated due to a difference in temperature between a curing temperature and a room temperature is applied to the base 6 or the like. In this condition, when a thermal stress or a humidity stress due to external environment is applied to the base 6, the base 6 or the like is likely to be deformed. Moreover, as a consequence of the deformation of the base 6 or the like, there is the possibility that the lead frame 4 is also deformed. Particularly, since the base 6 easily absorbs moisture in a high temperature and high humidity environment, the above-described deformation is likely to occur.

In the pressure sensor 30, since the controller 3 is in contact with the stress relief layer 32 made of a material having a low Young's modulus, it is possible to reduce a pressure to the controller 3 by deformation of the base 6 and the lead frame 4.

For this reason, even in the case where a thermal stress or a humidity stress is applied to the base 6 or the like due to variation in external environment, measurement functions of the temperature sensor 31 of the controller 3 are normally maintained, an occurrence of an output error in the temperature sensor 31 can be reduced.

Figure 7:
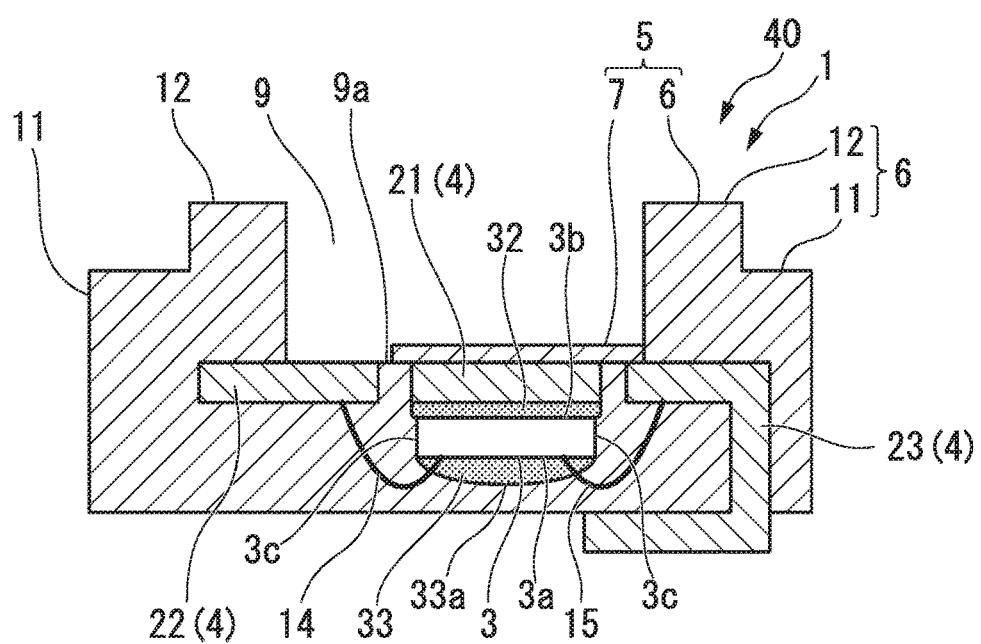
FIG. 7 is a cross-sectional side view showing a pressure sensor according to the third embodiment of the invention.

FIG. 7 is a cross-sectional side view showing a pressure sensor 40 serving as a pressure sensor according to a third embodiment of the invention.

The pressure sensor 40 described in this example is different from the pressure sensor 30 according to the second embodiment shown in FIG. 6 in that a stress relief layer is formed not only on the bottom surface 3b of the controller 3 but also on the outer surface 3a (the lower surface 3a).

Particularly, in the pressure sensor 40, the inner-face stress relief layer 32 is formed on the bottom surface 3b of the controller 3, and an outer-face stress relief layer 33 is formed on the outer surface 3a (the lower surface 3a, at least one of the plurality of surfaces) of the controller 3. The outer-face stress relief layer 33 is formed to cover the entire area of the outer surface 3a (the lower surface 3a) and is interposed between the outer surface 3a (the lower surface 3a) and the base 6. Consequently, the outer surface 3a (the lower surface 3a) is separated from the base 6.

The Young's modulus of the outer-face stress relief layer 33 is lower than the Young's modulus of the base 6. Particularly, the Young's modulus of the outer-face stress relief layer 33 is lower than the Young's modulus of the base 6 at the portion which faces the outer surface 3a of the controller 3 (the lower surface 3a) with the outer-face stress relief layer 33 interposed therebetween.

In the case where the outer-face stress relief layer 33 is not formed, the base 6 is a member that is in contact with the controller 3. Therefore, as compared with the case where the outer-face stress relief layer 33 is not formed, the outer surface 3a of the controller 3 (the lower surface 3a) is in touch with a member having a low Young's modulus.

The pressure sensor 40 may have the same configuration as that of the pressure sensor 30 shown in FIG. 6 with the exception that the outer-face stress relief layer 33 is provided.

In other cases, the outer-face stress relief layer 33 may be formed on only part of the outer surface 3a (the lower surface 3a) and may be formed in, for example, a shape including the portion that overlaps the temperature sensor 31 in plan view.

As the outer-face stress relief layer 33, a material having a low Young's modulus (silicone resin or the like) which is adopted as the preferred material associated with the stress relief layer 32 of the pressure sensor 30 according to the second embodiment can be used.

As the Young's modulus of the outer-face stress relief layer 33 and the Young's modulus ratio thereof to the base 6, it is preferable to adopt a preferred range which is associated with the stress relief layer 32 of the pressure sensor 30 according to the second embodiment.

The material used to form the outer-face stress relief layer 33 may be the same as the material used to form the stress relief layer 32 (the inner-face stress relief layer 32) or may be different from the stress relief layer 32.

The thickness (average thickness) of the outer-face stress relief layer 33 can be, for example, 5 μm to 400 μm (preferably, 100 μm to 400 μm). By setting the thickness to be 5 μm or more, a high degree of stress relief effect can be obtained. Furthermore, by setting the thickness to be 400 μm or less, the entire thickness can be reduced.

The outer surface 33a of the outer-face stress relief layer 33 is preferably a curved convex surface. The curved convex surface is, for example, a spherical surface, ellipsoidal spherical surface, or the like. Regarding the outer surface 33a, the entire surface thereof may be a curved convex surface or only part thereof may be a curved convex surface.

The cross-sectional shape of the outer surface 33a forming the curved convex surface may be, for example; a circular arc shape: a high-order curve shape (for example, quadratic curve shape) such as an ellipse arc shape, a parabolic shape, or a hyperbolic shape; or the like.

Since the outer surface 33a of the outer-face stress relief layer 33 has the curved convex surface, the thickness thereof gradually varies so that the thickness thereof is largest at the center of the outer-face stress relief layer 33 and the thickness becomes thin at the position close to the circumferential edge of the outer-face stress relief layer 33.

Since the outer surface 33a has the curved convex surface and a stress is less easily concentrated, the degree of the effect of reducing the influence of the deformation of the base 6 or the like on the controller 3 is increased, and it is possible to prevent an occurrence of an output error in the temperature sensor 31.

Moreover, since the outer surface 33a is the curved convex surface, a resin smoothly flows in a die during molding the base 6 by filling a die with the resin.

When the pressure sensor 40 is manufactured, the stress relief layer 32 is formed, the controller 3 is connected to the leads 22 and 23 via the bonding wires 14 and 15, respectively, thereafter, a material having a low Young's modulus is supplied to the outer surface 3a of the controller 3 (the lower surface 3a), the material is cured, and the outer-face stress relief layer 33 is thereby formed.

The method which supplies a uncured material having a low Young's modulus by use of a dispenser or the like, cures the material, and thereby forms a stress relief layer is preferable in that it is possible to form the outer-face stress relief layer 33 on a larger region such as the outer surface 3a (the lower surface 3a), as compared with a method of attaching a preliminarily-cured sheet thereto.

Subsequently, the support 5 is formed by resin-molding or the like, the pressure sensor chip 2 is provided thereon, the inside of the container 9 is filled with the protective material 8, and the pressure sensor 40 is thereby obtained.

In the pressure sensor 40, the outer-face stress relief layer 33 is formed not only on the bottom surface 3b of the controller 3 but also on the outer surface 3a (the lower surface 3a).

Since the stress relief layer is formed on a large surface area, the degree of the effect of reducing the influence of the deformation of the base 6 or the like on the controller 3 is increased, it is possible to prevent an occurrence of an output error in the temperature sensor 31.

Additionally, since the stress relief layer 33 is formed between the lead frame 4 and the base 6 that is made of a resin and is thereby likely to be deformed by moisture absorbing, the degree of the effect of preventing the influence of the deformation is improved as compared with the pressure sensor 30 having the stress relief layer 32 formed between the base 6 and the lead frame 4.

Figure 8:
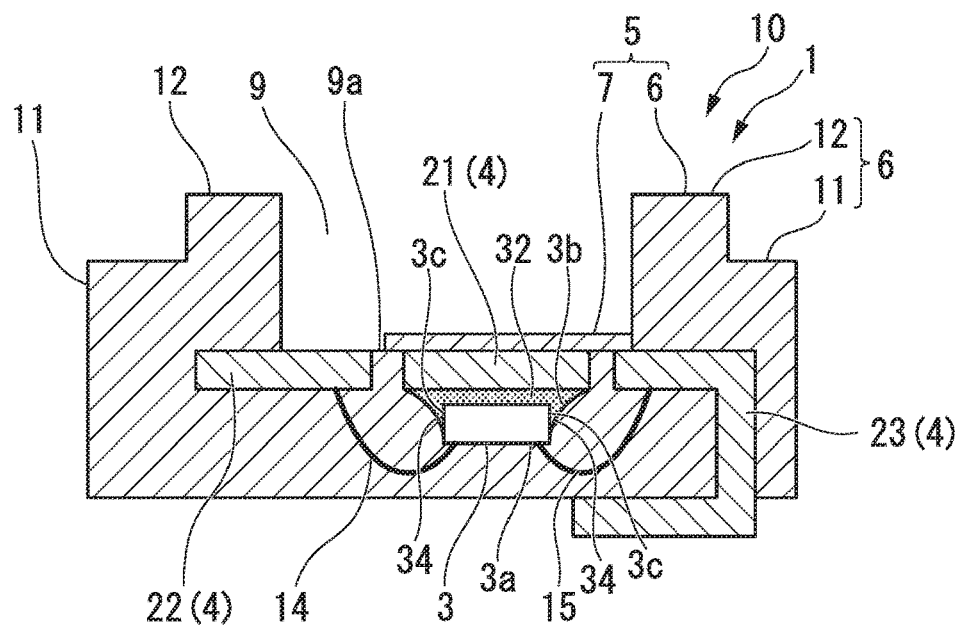
FIG. 8 is a cross-sectional side view showing a pressure sensor according to the fourth embodiment of the invention.

FIG. 8 is a cross-sectional side view showing a pressure sensor 50 serving as a pressure sensor according to a fourth embodiment of the invention.

The pressure sensor 50 described in this example is different from the pressure sensor 30 according to the second embodiment shown in FIG. 6 in that a stress relief layer is formed not only on the bottom surface 3b of the controller 3 but also on the side surface 3c.

Particularly, in the pressure sensor 50, the inner-face stress relief layer 32 is formed on the bottom surface 3b of the controller 3, and a side-face stress relief layer 34 is formed on the side surface 3c (at least one of the plurality of surfaces) of the controller 3. The pressure sensor 50 may have the same configuration as that of the pressure sensor 30 shown in FIG. 6 with the exception that the side-face stress relief layers 34 is provided.

The side-face stress relief layers 34 is formed to cover the entire area of the side surfaces 3c and is interposed between the side surfaces 3c and the base 6. For this reason, the side surface 3c is separated from the base 6. The side-face stress relief layers 34 can be formed integrally with the inner-face stress relief layer 32.

In other cases, the side-face stress relief layers 34 may be formed on only part of the side surface 3c. In this case, it is preferable that 50 to 95% of the side surface 3c of the controller 3 be covered with the side-face stress relief layers 34.

As the side-face stress relief layers 34, a material having a low Young's modulus (silicone resin or the like) which is adopted as the preferred material associated with the stress relief layer 32 of the pressure sensor 30 according to the second embodiment can be used.

As the Young's modulus of the side-face stress relief layers 34 and the Young's modulus ratio thereof to the base 6, it is preferable to adopt a preferred range which is associated with the stress relief layer 32 of the pressure sensor 30 according to the second embodiment.

The thickness (average thickness) of the side-face stress relief layers 34 can be, for example, 5 μm to 500 μm (preferably, 50 μm to 300 μm). By setting the thickness of the stress relief layer 32 to be 5 μm or more, a high degree of stress relief effect can be obtained. Furthermore, by setting the thickness to be 500 μm or less, the entire thickness can be reduced.

When the pressure sensor 50 is manufactured, the stress relief layer 32 is formed, a material having a low Young's modulus is supplied to the side surface 3c of the controller 3, the material is cured, and the side-face stress relief layers 34 is thereby formed. Next, the controller 3 is connected to the leads 22 and 23 via the bonding wires 14 and 15, respectively.

Subsequently, the support 5 is formed by resin-molding or the like, the pressure sensor chip 2 is provided thereon, the inside of the container 9 is filled with the protective material 8, and the pressure sensor 50 is thereby obtained.

In other cases, as a method of forming the side-face stress relief layers 34, a method can be adopted which determines the supply amount of a material having a low Young's modulus used to form the stress relief layer 32 to be greater than a required amount, allows the material having a low Young's modulus to overflow from between the bottom surface 3b of the controller 3 and the lead frame 4 when the controller 3 is provided, and thereby forms the side-face stress relief layers 34 by the overflowed portion.

In the pressure sensor 50, since the stress relief layers 34 is formed not only on the bottom surface 3b of the controller 3 but also on the side surface 3c, the degree of the effect of reducing the influence of the deformation of the base 6 or the like on the controller 3 is increased, and it is possible to prevent an occurrence of an output error in the temperature sensor 31.

Figure 9:
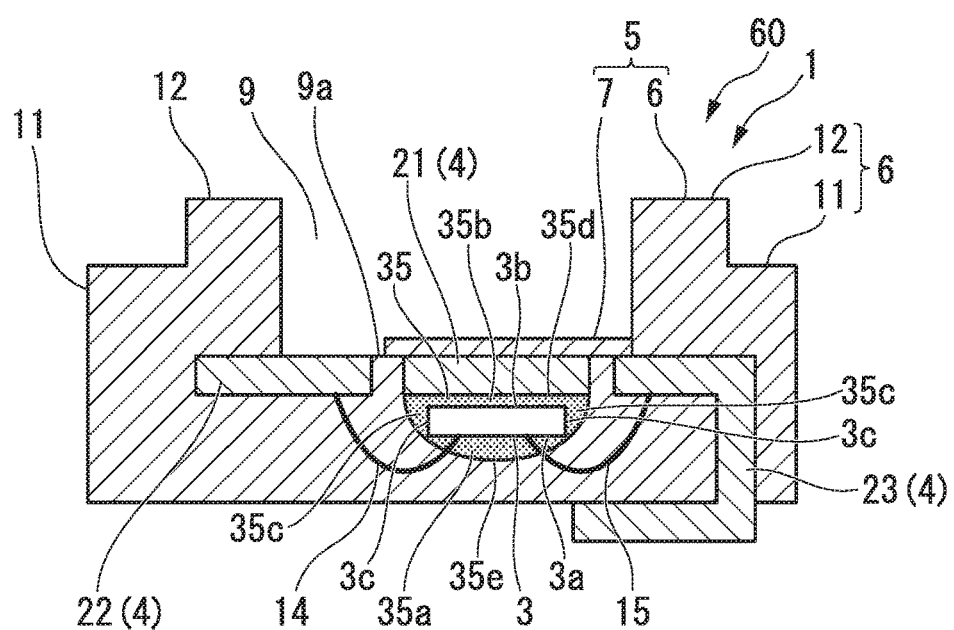
FIG. 9 is a cross-sectional side view showing a pressure sensor according to the fifth embodiment of the invention.

FIG. 9 is a cross-sectional side view showing a pressure sensor 60 serving as a pressure sensor according to a fifth embodiment of the invention.

The pressure sensor 60 described in this example is different from the pressure sensor 30 according to the second embodiment shown in FIG. 6 in that a stress relief layer 35 is formed to cover the bottom surface 3b, the side surfaces 3c, and the outer surface 3a (the lower surface 3a) of the controller 3.

The stress relief layer 35 includes: an inner-face stress relief layer 35b that covers the bottom surface 3b of the controller 3; a side-face stress relief layer 35c that covers the side surfaces 3c; and an outer-face stress relief layer 35a that covers the outer surface 3a (the lower surface 3a). The stress relief layers 35b, 35c, and 35a can be integrally formed into a body.

The stress relief layer 35 has: an inner surface 35d that comes into contact with the lead frame 4; and an outer surface 35e that comes into contact with the base 6.

Since the stress relief layer 35 is formed to cover the entire surface of the controller 3, the controller 3 arranged separately from the base 6 and the lead frame 4.

It is preferable that the outer surface 35e of the stress relief layer 35 be a curved convex surface. Regarding the outer surface 35e, the entire surface thereof may be a curved convex surface or only part thereof may be a curved convex surface.

Since the outer surface 35e of the stress relief layer 35 forms the curved convex surface, the thickness thereof gradually varies so that the thickness thereof is largest at the center of the stress relief layer 35 and the thickness becomes thin at the position close to the circumferential edge of the stress relief layer 35.

In the pressure sensor 60, since the outer surface 35e of the stress relief layer 35 is the curved convex surface, a stress is less easily concentrated. Particularly, since the outer surface 35c of the stress relief layer 35 is the curved convex surface, a stress that is transmitted from the base 6 to the stress relief layer 35 is uniformly applied to the entire surface of the curved outer surface 35e of the stress relief layer 35. For this reason, the degree of the effect of reducing the influence of the deformation of the base 6 or the like on the controller 3 is increased, and it is possible to prevent an occurrence of an output error in the temperature sensor 31.

Furthermore, the outer surface 35e is the curved convex surface, a resin smoothly flows in a die during molding the base 6 by filling a die with the resin.

The pressure sensor 60 may have the same configuration as that of the pressure sensor 30 shown in FIG. 6 with the exception that the stress relief layer 35 is provided.

As the stress relief layer 35, a material having a low Young's modulus (silicone resin or the like) which is adopted as the preferred material associated with the stress relief layer 32 of the pressure sensor 30 according to the second embodiment can be used.

As the Young's modulus of the stress relief layer 35 and the Young's modulus ratio thereof to the base 6, it is preferable to adopt a preferred range which is associated with the stress relief layer 32 of the pressure sensor 30 according to the second embodiment.

The pressure sensor 60 can be manufactured by combining the methods of manufacturing the aforementioned pressure sensors 30 to 50. For example, the following manufacturing method is possible.

A material having a low Young's modulus is supplied to the controller 3 or the pedestal 21 by a dispenser or the like, the material is cured by heating or the like, the inner-face stress relief layer 35b is thereby formed, and also the material having a low Young's modulus is supplied to the side surfaces 3c of the controller 3, and the side-face stress relief layer 35c is thereby formed. Next, the controller 3 is connected to the leads 22 and 23 via the bonding wires 14 and 15, respectively, thereafter, the material having a low Young's modulus is supplied to the outer surface 3a of the controller 3 (the lower surface 3a), and the outer-face stress relief layer 35a is thereby formed.

Subsequently, the support 5 is formed by resin-molding or the like, the pressure sensor chip 2 is provided thereon, the inside of the container 9 is filled with the protective material 8, and the pressure sensor 60 is thereby obtained.

As a method of forming the side-face stress relief layer 35c, a method can be adopted which determines the supply amount of a material having a low Young's modulus used to form the inner-face stress relief layer 35b to be greater than a required amount, allows the material having a low Young's modulus to overflow from between the bottom surface 3b of the controller 3 and the lead frame 4 when the controller 3 is provided, and thereby forms the side-face stress relief layer 35c by the overflowed portion.

In the pressure sensor 60, since the stress relief layer 35 is formed to cover the entire surface of the controller 3, the degree of the effect of reducing the influence of the deformation of the base 6 or the like on the controller 3 is further increased, and it is possible to prevent an occurrence of an output error in the temperature sensor 31.

Figure 10:
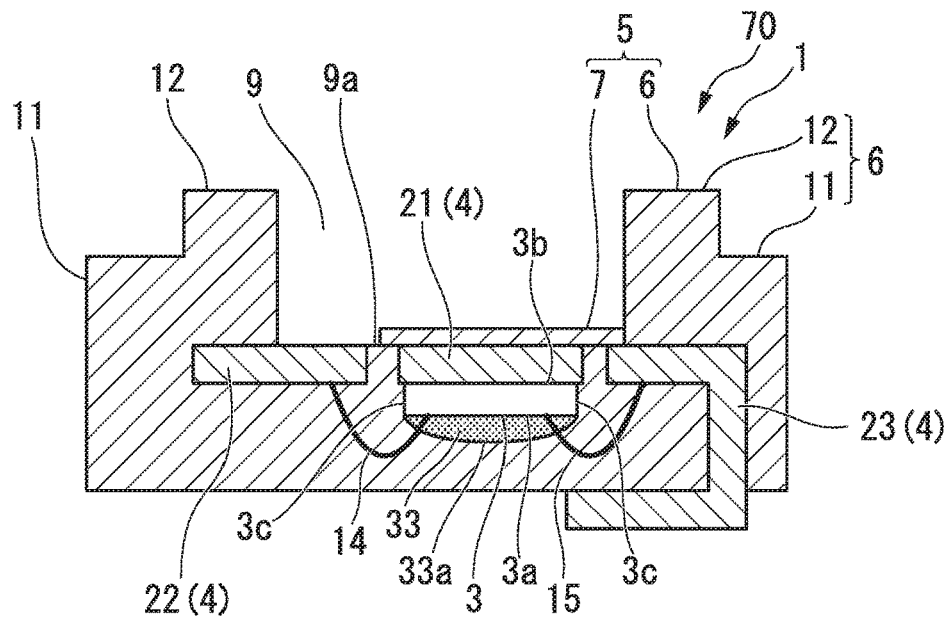
FIG. 10 is a cross-sectional side view showing a pressure sensor according to the sixth embodiment of the invention.

FIG. 10 is a cross-sectional side view showing a pressure sensor 70 serving as a pressure sensor according to a sixth embodiment of the invention.

The pressure sensor 70 described in this example is different from the pressure sensor 40 according to the third embodiment shown in FIG. 7 in that the inner-face stress relief layer 32 is not formed on the bottom surface 3b of the controller 3.

In the pressure sensor 70, since the outer-face stress relief layer 33 is formed on the outer surface 3a (the lower surface 3a) that is located near the temperature sensor 31, the degree of the effect of reducing the influence of the deformation of the base 6 or the like on the controller 3 is increased, and it is possible to prevent an occurrence of an output error in the temperature sensor 31.

Figure 11:
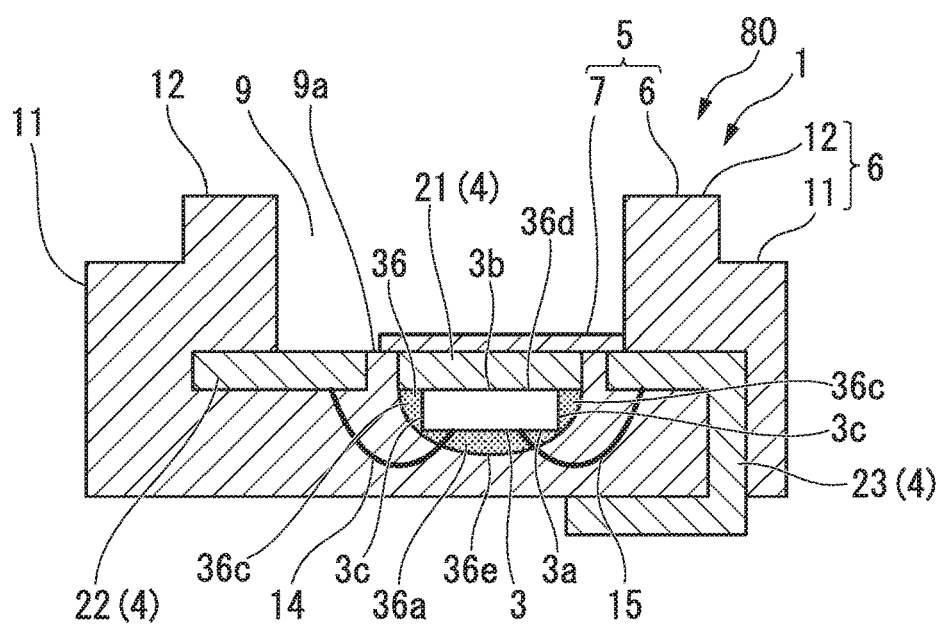
FIG. 11 is a cross-sectional side view showing a pressure sensor according to the seventh embodiment of the invention.

FIG. 11 is a cross-sectional side view showing a pressure sensor 80 serving as a pressure sensor according to a seventh embodiment of the invention.

The pressure sensor 80 described in this example is different from the pressure sensor 60 according to the fifth embodiment shown in FIG. 9 in that a stress relief layer is not formed on the bottom surface 3b of the controller 3.

A stress relief layer 36 includes: a side-face stress relief layer 36c that covers the side surfaces 3c of the controller 3; and an outer-face stress relief layer 36a that covers the outer surface 3a (the lower surface 3a). The stress relief layers 36c and 36a can be integrally formed into a body.

The stress relief layer 36 has: an inner surface 36d that comes into contact with the lead frame 4; and an outer surface 36e that comes into contact with the base 6.

Since the stress relief layer 36 is formed on the side surfaces 3c and the outer surface 3a (the lower surface 3a), the controller 3 is separated from the base 6.

It is preferable that the outer surface 36e of the stress relief layer 36 be a curved convex surface.

In the pressure sensor 80, since the stress relief layer 36 is formed, the degree of the effect of reducing the influence of the deformation of the base 6 or the like on the controller 3 is further increased, it is possible to prevent an occurrence of an output error in the temperature sensor 31.

EXAMPLES

Example 1

The pressure sensor 10 shown in FIGS. 1 and 2 was manufactured as follows.

As the controller 3, a controller was used which includes: the temperature sensor 31 (refer to FIG. 6); an A/D converter that A/D-converts a signal output from the temperature sensor 31 and outputs the signal as a temperature signal; and a processor that carries out a process of correcting the sensor signal output from the pressure sensor chip 2 based on the temperature signal.

The controller 3 was mounted on the pedestal 21 of the lead frame 4 and was connected to the leads 22 and 23 via the bonding wires 14 and 15, respectively. Next, the support 5 was formed by resin-molding.

The pressure sensor chip 2 was disposed on the mounting portion 7, the pressure sensor chip 2 was connected to the sensor leads 22 via the bonding wires 13, thereafter the inside of the container 9 was filled with the protective material 8, and thereby the pressure sensor 10 was obtained.

Example 2

The pressure sensor 30 shown in FIG. 6 was manufactured. The stress relief layer 32 was formed by supplying an uncured silicone resin by a dispenser, and the silicone resin was cured by heating or the like, and the silicone resin was thereby formed. The thickness of the stress relief layer 32 was 10 μm.

The configuration was the same as that of Example 1 except for the stress relief layer 32.

Example 3

The pressure sensor 40 shown in FIG. 7 was manufactured.

The stress relief layers 32 and 33 were formed of silicone resin in a way similar to the case of Example 2. The outer surface 33a of the outer-face stress relief layer 33 was formed in a curved convex surface shape. The thickness (average thickness) of the outer-face stress relief layer 33 was 200 μm.

The configuration was the same as that of Example 2 except for the stress relief layer 33.

Example 4

The pressure sensor 50 shown in FIG. 8 was manufactured.

The stress relief layers 32 and 34 were formed of silicone resin in a way similar to the case of Example 2. The thickness (average thickness) of the side-face stress relief layers 34 was 100 μm.

The configuration was the same as that of Example 2 except for the stress relief layer 34.

Example 5

The pressure sensor 60 shown in FIG. 9 was manufactured.

The stress relief layer 35 was formed of silicone resin in a way similar to the case of Example 2. The thickness of the stress relief layer 35b was the same as the thickness of the stress relief layer 32 Example 2. The thickness (average thickness) of the stress relief layer 35c was the same as the thickness of the stress relief layers 34 of Example 3. The thickness (average thickness) of the stress relief layer 35a was the same as the thickness of the stress relief layer 33 of Example 4.

The configuration was the same as that of Example 1 except for the stress relief layer 35.

(High Temperature and High Humidity Testing)

After the pressure sensors of Examples 1 to 5 were subjected to a high temperature and high humidity condition (the temperature is 60° C. and the degree of humidity is 90%) for 100 hours, thereafter the pressure sensors were subjected to a normal temperature and normal humidity condition (the temperature was 25° C. and the degree of humidity was 50%) for 2 hours, and output values of the temperature sensor 31 thereof were examined. Differences (errors) between the output values and correct temperature are shown in Table 1.

TABLE 1

|  | OUTPUT FROM TEMPERATURE SENSOR | ERROR OF OUTPUT |
| --- | --- | --- |
| EXAMPLE 1 | 28.5° C. | +3.5° C. |
| EXAMPLE 2 | 27.5° C. | +2.5° C. |
| EXAMPLE 3 | 27.1° C. | +2.1° C. |
| EXAMPLE 4 | 26.9° C. | +1.9° C. |
| EXAMPLE 5 | 25.1° C. | +0.1° C. |

It was found from Table 1 that, in Examples 2 to 5 in which the stress relief layers are provided, even after the pressure sensors are subjected to a high temperature and high humidity condition for a long period of time, it is possible to reduce errors of output of the temperature sensors 31. Accordingly, it was possible to improve the measurement accuracy of the pressure sensors of Examples 2 to 5.

Particularly, in Example 5 in which the stress relief layer 35 that covers the entire surface of the controller 3 is provided, it is possible to reduce the error of output thereof. As a result, it was possible to improve the measurement accuracy of the pressure sensor of Example 5.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

In the invention, the shape (outer shape) of the controller is not limited to the rectangular parallelepiped shape (hexahedron) and may be other polyhedron shape (the number of surfaces is greater than or equal to an arbitrary integer of 4). Moreover, the shape of the controller is not limited to a polyhedron shape and may be formed in a shape having a plurality of surfaces and a shape having one or more curved surfaces of the plurality of the surfaces (a circular cylinder shape, a hemispherical shape, or the like).

The stress relief layer can be formed on part of the region or the entire region of at least one of the surfaces of the controller having the plurality of the surfaces.

Moreover, the shape of the controller is not limited to the shape having the plurality of the surfaces. As long as the stress relief layer is formed on at least part of the surface of the controller, the aforementioned effect (reduction in an error of output of controller) is obtained.

The regions on which the stress relief layers are formed are not limited to the regions shown in FIGS. 6 to 11. For example, the stress relief layer may be formed on only the side surface 3c.

DESCRIPTION OF REFERENCE NUMERAL

1 . . . base body, 2 . . . pressure sensor chip, 3 . . . controller, 4 . . . lead frame, 5 . . . support, 6 . . . base, 7 . . . mounting portion, 8 . . . protective material, 9 . . . container, 10, 30 . . . pressure sensor, 13 to 15 . . . bonding wire, 32 . . . stress relief layer (inner-face stress relief layer), 33 . . . outer-face stress relief layer, 34 . . . side-face stress relief layer, 35, 36 . . . stress relief layer.

What is claimed is:

1. A semiconductor pressure sensor comprising:
   a base body comprising: a lead frame having a first surface and a second surface; and a support that supports the lead frame and is made of a resin;
   a pressure sensor chip provided on the first surface of the lead frame; and
   a controller that is provided on the second surface of the lead frame, is implanted in the support, is formed in a shape having a plurality of surfaces, and receives a sensor signal output from the pressure sensor chip and thereby outputs a pressure detection, the pressure sensor chip at least partially overlapping the controller in plan view, wherein
   the support comprises: a base; and a mounting portion on which the pressure sensor chip is mounted, and
   the mounting portion is formed of a material having a hardness lower than a material used to form the base.

2. The semiconductor pressure sensor according to claim 1, further comprising:
   a stress relief layer that is formed by use of one material, formed on the plurality of surfaces of the controller so as to cover an entire surface of the controller, and has a Young's modulus lower than that of the support.

3. The semiconductor pressure sensor according to claim 1, wherein
   a surface area of the pressure sensor chip is substantially the same as that of the controller in plan view, and a shape of the pressure sensor chip is substantially the same as that of the controller in plan view, and
   the pressure sensor chip and the controller are disposed such that each of the surface areas of the pressure sensor chip and the controller is substantially the same as a surface area of a region on which the controller overlaps the pressure sensor chip in plan view.

4. The semiconductor pressure sensor according to claim 2, wherein the stress relief layer has an external surface forming a curved convex surface.

5. The semiconductor pressure sensor according to claim 2, wherein the Young's modulus of the stress relief layer is less than or equal to 1/10 of a Young's modulus of the support.

6. The semiconductor pressure sensor according to claim 1, wherein
   each of the pressure sensor chip and the controller is connected to the lead frame via a bonding wire.

7. The semiconductor pressure sensor according to claim 1, wherein
   a container that accommodates the pressure sensor chip therein is formed on the base,
   the container is filled with a protective material that covers the pressure sensor chip, and
   the protective material is capable of transmitting, to the pressure sensor chip, a pressure applied from a measurement object.

8. The semiconductor pressure sensor according to claim 1, wherein
   the lead frame is implanted in the support.

9. The semiconductor pressure sensor according to claim 1, wherein in a development view showing the pressure sensor chip and the controller, the controller contains the entirety of the pressure sensor chip.

* * * * *